United States Patent
Song et al.

(10) Patent No.: US 10,723,887 B2
(45) Date of Patent: Jul. 28, 2020

(54) UV CURABLE INTERPLAYER FOR ELECTRONIC PRINTING

(71) Applicant: XEROX CORPORATION, Norwalk, CT (US)

(72) Inventors: Guiqin Song, Milton (CA); Nan-Xing Hu, Oakville (CA); Naveen Chopra, Oakville (CA); Marcel P. Breton, Mississauga (CA)

(73) Assignee: XEROX CORPORATION, Norwalk, CT (US)

( * ) Notice: Subject to any disclaimer, the term of this patent is extended or adjusted under 35 U.S.C. 154(b) by 185 days.

(21) Appl. No.: 16/048,896

(22) Filed: Jul. 30, 2018

(65) Prior Publication Data

US 2018/0334570 A1 Nov. 22, 2018

Related U.S. Application Data

(62) Division of application No. 15/227,442, filed on Aug. 3, 2016, now Pat. No. 10,233,332.

(51) Int. Cl.

| | | |
|---|---|---|
| *C08J 3/28* | (2006.01) | |
| *C23C 26/00* | (2006.01) | |
| *B05D 1/38* | (2006.01) | |
| *C09D 4/00* | (2006.01) | |
| *C09D 133/14* | (2006.01) | |
| *C09D 133/00* | (2006.01) | |
| *C09D 7/63* | (2018.01) | |
| *H05K 3/38* | (2006.01) | |
| *B05D 1/00* | (2006.01) | |
| *B05D 3/02* | (2006.01) | |
| *B05D 3/06* | (2006.01) | |
| *H05K 1/09* | (2006.01) | |

(52) U.S. Cl.
CPC .............. *C09D 4/00* (2013.01); *B05D 1/005* (2013.01); *B05D 1/38* (2013.01); *B05D 3/0254* (2013.01); *B05D 3/067* (2013.01); *C08J 3/28* (2013.01); *C09D 7/63* (2018.01); *C09D 133/00* (2013.01); *C09D 133/14* (2013.01); *C23C 26/00* (2013.01); *H05K 3/386* (2013.01); *H05K 1/097* (2013.01)

(58) Field of Classification Search
None
See application file for complete search history.

(56) References Cited

U.S. PATENT DOCUMENTS

| | | | |
|---|---|---|---|
| 6,426,034 B1 * | 7/2002 | McComas | C08J 7/0427 264/494 |
| 7,270,694 B2 | 9/2007 | Li et al. | |
| 7,498,070 B2 | 3/2009 | Ishibashi et al. | |
| 8,057,849 B2 | 11/2011 | Liu et al. | |
| 8,158,032 B2 | 4/2012 | Liu et al. | |
| 8,298,314 B2 | 10/2012 | Li | |
| 8,324,294 B2 | 12/2012 | Wu et al. | |
| 8,361,350 B2 | 1/2013 | Wu et al. | |
| 8,558,117 B2 * | 10/2013 | Hanson | C09D 11/52 174/256 |
| 8,765,025 B2 | 7/2014 | Wu et al. | |
| 9,333,742 B2 | 5/2016 | Moorlag et al. | |
| 2010/0055484 A1 | 3/2010 | Chretien et al. | |
| 2011/0100454 A1 | 5/2011 | Adam et al. | |
| 2011/0198113 A1 * | 8/2011 | Hanson | C09D 11/52 174/257 |
| 2012/0168211 A1 | 7/2012 | Lu et al. | |
| 2013/0344299 A1 | 12/2013 | Sharygin et al. | |
| 2014/0053754 A1 | 2/2014 | Chopra et al. | |
| 2015/0132476 A1 | 5/2015 | Wu et al. | |

FOREIGN PATENT DOCUMENTS

| | | |
|---|---|---|
| EP | 2 061 845 | 5/2009 |
| FR | 2 951 402 A1 | 4/2011 |

OTHER PUBLICATIONS

European Patent Office: Extended European Search Report re: Xerox Patent Application No. 17182704.1 dated Dec. 11, 2017, six pages.

* cited by examiner

*Primary Examiner* — Sheeba Ahmed
(74) *Attorney, Agent, or Firm* — Pillsbury Winthrop Shaw Pittman, LLP

(57) ABSTRACT

UV-curable interlayer compositions are provided. In embodiments, the interlayer composition comprises at least one aliphatic di(meth)acrylate monomer diluent having a dynamic viscosity at 25° C. of less than about 100 cps; at least one (meth)acrylate oligomer selected from epoxy (meth)acrylates, polyester (meth)acrylates, polyether (meth)acrylates, urethane (meth)acrylates and combinations thereof, the at least one (meth) acrylate oligomer having a glass transition temperature in the range of from about minus 10° C. to about 100° C. and a dynamic viscosity at 25° C. of less than about 3000 cps; and at least two photoinitiators. Multilayer structures formed using the compositions and related methods are also provided.

19 Claims, No Drawings

UV CURABLE INTERPLAYER FOR ELECTRONIC PRINTING

CROSS REFERENCE TO RELATED APPLICATIONS

This application is a divisional application of U.S. application Ser. No. 15/227,442, filed Aug. 3, 2016, which is incorporated herein by reference in its entirety

BACKGROUND

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), radio frequency identification (RFID) tags, photovoltaics, and the like. However, the deposition and/or patterning of functional electrodes, pixel pads, and conductive traces, lines and tracks which meet the conductivity, processing, and cost requirements for practical applications have been challenging.

Solution-processable conductive inks, including metal nanoparticle inks, are of great interest for fabricating such electronic circuit elements. For example, silver nanoparticle inks are a promising class of materials for printed electronics. In this regard, fabrication of electronic circuit elements using silver nanoparticle inks has been described in, for example, U.S. Pat. Nos. 8,765,025; 8,361,350; 8,324,294; 8,298,314; 8,158,032; 8,057,849; and 7,270,694, each of which is hereby incorporated by reference in its entirety. However, one issue encountered with metal nanoparticle inks, including silver nanoparticle inks, is a trade-off between the electrical conductivity of the sintered metal nanoparticles and their adhesion to the underlying substrate, e.g., a highly conductive layer of sintered metal nanoparticles may have very poor adhesion. Simply rubbing and/or contacting the surface of the printed metal features formed from such metal nanoparticle inks can damage the features, thus limiting their functionality and utility in the electronic devices. The issue of adhesion has been previously addressed by the adjusting the composition of the metal nanoparticle inks and/or the use of thermally curable interlayer compositions. Thermally curable interlayer compositions typically require high curing temperatures (e.g., from about 120° C. to about 150° C.) and long curing times (e.g., from about 2 hours to about 5 hours).

SUMMARY

The present disclosure, which enables curing at lower temperatures or for less time, accordingly provides illustrative examples of interlayer compositions, interlayer films, and multilayer structures containing these interlayer films, as well as associated methods of producing these interlayer compositions and films, and their assembled multilayer structures.

In one aspect, a UV-curable interlayer composition is provided. In embodiments, the interlayer composition comprises at least one aliphatic di(meth)acrylate monomer diluent having a dynamic viscosity at 25° C. of less than about 100 cps; at least one (meth)acrylate oligomer selected from epoxy (meth)acrylates, polyester (meth)acrylates, polyether (meth)acrylates, urethane (meth)acrylates and combinations thereof, the at least one (meth) acrylate oligomer having a glass transition temperature in the range of from about minus 10° C. to about 100° C. and a dynamic viscosity at 25° C. of less than about 3000 cps; and at least two photoinitiators.

In another aspect, a multilayer structure is provided. In embodiments, the multilayer structure comprises a substrate; an interlayer film on the substrate, and a conductive layer on the interlayer film, the conductive layer comprising sintered metal nanoparticles. The interlayer film is formed from a UV curable interlayer composition comprising at least one aliphatic di(meth)acrylate monomer diluent having a dynamic viscosity at 25° C. of less than about 100 cps; at least one (meth)acrylate oligomer selected from epoxy (meth)acrylates, polyester (meth)acrylates, polyether (meth)acrylates, urethane (meth)acrylates and combinations thereof, the at least one (meth) acrylate oligomer having a glass transition temperature in the range of from about minus 10° C. to about 100° C. and a dynamic viscosity at 25° C. of less than about 3000 cps; and at least two photoinitiators.

In another aspect, a process of forming a multilayer structure is provided. In embodiments, the process comprises depositing a UV-curable interlayer composition on a substrate; exposing the deposited interlayer composition to UV light under conditions sufficient to cure the interlayer composition to form a cured interlayer film; depositing a conductive composition comprising metal nanoparticles on the cured interlayer film; and annealing the conductive composition to produce a conductive layer comprising sintered metal nanoparticles. The interlayer composition comprises at least one aliphatic di(meth)acrylate monomer diluent having a dynamic viscosity at 25° C. of less than about 100 cps; at least one (meth)acrylate oligomer selected from epoxy (meth)acrylates, polyester (meth)acrylates, polyether (meth)acrylates, urethane (meth)acrylates and combinations thereof, the at least one (meth)acrylate oligomer having a glass transition temperature in the range of from about minus 10° C. to about 100° C. and a dynamic viscosity at 25° C. of less than about 3000 cps; and at least two photoinitiators.

These and other aspects will be discussed in greater detail below.

DETAILED DESCRIPTION

The present disclosure provides interlayer compositions, interlayer films, multilayer structures containing the interlayer films, and related methods. The interlayer compositions are curable using ultraviolet (UV) light to provide the interlayer films. In embodiments, the interlayer films are produced more efficiently (e.g., less than a minute) under conditions (e.g., room temperature) which are more compatible with processing techniques for electronic devices (e.g., ink jet printing), by contrast to thermally curable interlayer compositions. Moreover, in embodiments, the interlayer films provide excellent adhesion of conductive layers (e.g., those containing sintered silver nanoparticles) to an underlying substrate (e.g., glass or a flexible polymeric substrate), while maintaining the conductivity and mechanical robustness of such conductive layers.

Interlayer Composition

In embodiments, the interlayer composition contains at least one multi-functional (meth)acrylate monomer diluent, at least one (meth)acrylate oligomer, and at least one photoinitiator.

A variety of multi-functional (meth)acrylate monomer diluents may be used. Combinations of different types of multi-functional (meth)acrylate monomer diluents may be used. As used throughout this specification the term "(meth)

acrylate" encompasses both methacrylate and acrylate compounds. In other embodiments, the interlayer composition contains a single type of multi-functional (meth)acrylate monomer diluent. Suitable multi-functional (meth)acrylate monomer diluents include di-functional (meth)acrylate monomer diluents such as aliphatic di(meth)acrylates. The aliphatic portion of these monomer diluents may include saturated or unsaturated bonds and may be linear, branched or cyclic. For example, di-functional aliphatic (meth)acrylates containing a cyclic structure may be used. The number of carbon atoms in the aliphatic portion may vary, for example, in the range of from 2 to 48, in embodiments from 2 to 38, in embodiments from 2 to 28, or in embodiments from 2 to 22.

Suitable aliphatic di(meth)acrylates include alkoxylated neopentyl glycol di(meth)acrylates. In such alkoxylated neopentyl glycol di(meth)acrylates, the number of carbon atoms in the aliphatic portion may vary, for example, in the range of from 7 to 17, from 7 to 13, or from 9 to 11. Alkoxylated neopentyl glycol di(meth)acrylates such as ethoxylated neopentyl glycol di(meth)acrylate and propoxylated neopentyl glycol di(meth)acrylate may be used. Other aliphatic di(meth)acrylates include alkyldiol di(meth) acrylates. In such alkyldiol di(meth) acrylates, the number of carbon atoms in the alkyldiol portion may vary, for example, in the range of from 4 to 20, from 6 to 18, or from 6 to 12. The alkyl portion may be linear, branched or cyclic. Alkyldiol di(meth)acrylates such as hexanediol di(meth)acrylate, decanediol di(meth)acrylate, and tricyclodecane dimethanol di(meth)acrylate may be used. Alkoxylated versions of these alkyldiol di(meth)acrylates may be used (e.g., alkoxylated hexanediol di(meth)acrylate), in which case the number of carbon atoms in entire aliphatic portion may vary as described above. Other aliphatic di(meth)acrylates include alkyl glycol di(meth)acrylates. In such alkyl glycol di(meth) acrylates, the number of carbon atoms in the alkyl portion may vary, for example, in the range of from 2 to 12, from 2 to 10, or from 2 to 6. Alkyl glycol di(meth)acrylates such as tripropylene glycol di(meth)acrylate, dipropylene glycol di(meth)acrylate, and ethylene glycol di(meth)acrylate may be used.

Di-functional aliphatic (meth)acrylates available from Sartomer Co., Inc., may be used, including propoxylated neopentyl glycol diacrylate (SR9003B), 1,6-hexanediol diacrylate (SR238B), alkoxylated aliphatic diacrylate (SR9209A), alkoxylated hexanediol diacrylate (CD564), and 1,3-butylene glycol dimethacrylate (SR297).

In embodiments, the multi-functional (meth)acrylate monomer diluent has a molecular weight in the range of from about 100 g/mol to about 1000 g/mol, in embodiments, of from about 150 g/mol to about 800 g/mol, or in embodiments of from about 200 g/mol to about 600 g/mol. In embodiments, the multi-functional (meth)acrylate monomer diluent has a dynamic viscosity at 25° C. of less than about 100 cps, in embodiments less than 50 cps, in embodiments less than about 20 cps. This includes embodiments in which the multi-functional (meth)acrylate monomer diluent has a dynamic viscosity at 25° C. in the range of from about 3 cps to about 100 cps, in embodiments of from about 5 cps to about 80 cps, in embodiments of from about 7 cps to about 60 cps, or in embodiments from about 7 cps to about 20 cps.

The multi-functional (meth)acrylate monomer diluent may be provided in the interlayer composition in various suitable amounts. The amount may be selected to adjust the dynamic viscosity of the interlayer composition so that the composition can be deposited using the techniques described below (e.g., printing, spin coating). In embodiments, the multi-functional (meth)acrylate monomer diluent is present in an amount of from about 50% to about 95% by weight of the interlayer composition, in embodiments of from about 55% to about 90% by weight of the interlayer composition, in embodiments of from about 60% to about 85% by weight of the interlayer composition, or in embodiments of from about 65% to about 80% by weight of the interlayer composition.

The interlayer composition may include other multi-functional (meth)acrylate monomer diluents such as tri-functional aliphatic (meth)acrylates, tetra-functional aliphatic (meth)acrylates and penta-functional aliphatic (meth) acrylates. Suitable tri-functional aliphatic (meth)acrylates include aliphatic tri(meth)acrylates such as, for example, trimethylolpropane tri(meth)acrylate, glycerol propoxylate tri(meth)acrylate, tris(2-hydroxy ethyl) isocyanurate tri(meth)acrylate, propoxylated trimethylolpropane tri(meth) acrylate, ethoxylated trimethylolpropane tri(meth)acrylate, and the like. Tri-functional aliphatic (meth)acrylates available from Sartomer Co., Inc., may be used, including ethoxylated (3) trimethylolpropane triacrylate (SR454), ethoxylated (6) trimethylolpropane triacrylate (SR499), ethoxylated trimethylolpropane triacrylate (SR455LM), trimethylolpropane triacrylate (SR351LV), and propoxylated (3) trimethylolpropane triacrylate (SR492).

Suitable tetra-functional aliphatic (meth)acrylates include di-trimethylolpropane tetraacrylate (available from Sartomer Co., Inc as SR355), ethoxylated (4) pentaerythritol tetraacrylate (available from Sartomer Co., Inc. as SR494), and pentaerythritol tetraacrylate (available from Sartomer Co., Inc. as SR295). Suitable penta-functional aliphatic (meth)acrylates include dipentaerythritol pentaacrylate (available from Sartomer Co., Inc. as SR399) and pentaacrylate ester (available from Sartomer Co., Inc. as SR9041).

When tri-functional aliphatic (meth)acrylates, tetra-functional aliphatic (meth)acrylates and/or penta-functional aliphatic (meth)acrylates are included in the interlayer compositions, in embodiments, they may be included in an amount of no more than about 5% by weight of the interlayer composition, no more than about 3% by weight of the interlayer composition, no more than about 1% by weight of the interlayer composition or no more than about 0.5% by weight of the interlayer composition.

A variety of (meth)acrylate oligomers may be used. The (meth)acrylate oligomer may be selected to improve film formation and crosslinking within the interlayer and to improve the adhesion of the interlayer film formed from the composition to an underlying substrate. Suitable (meth) acrylate oligomers include epoxy (meth)acrylates, polyester (meth)acrylates, polyether (meth)acrylates, urethane (meth) acrylates and combinations thereof. Suitable acrylate oligomers include SD-5907 and SD-661, available from DIC Imaging Corporation. Although in embodiments combinations of different types of (meth)acrylate oligomers are used, in other embodiments, the interlayer composition contains a single type of (meth)acrylate oligomer.

In embodiments, the (meth)acrylate oligomer has a number average molecular weight $M_n$ in the range of from about 300 to about 3000, in embodiments, of from about 500 to about 2500, in embodiments of from about 1000 to about 2000, in embodiments of from about 1950 to about 3000, in embodiments of from about 2450 to about 3000, in embodiments of from about 450 to about 2500, in embodiments of from about 450 to about 2000, in embodiments of from about 450 to about 1500, or in embodiments of from about 450 to about 1000. In embodiments, the (meth)acrylate oligomer has a dynamic viscosity at 25° C. of less than about 3000 cps, in embodiments less than about 1250 cps, or in embodiments less than about 1500. This includes embodiments in which the (meth)acrylate oligomer has a dynamic viscosity at 25° C. in the range of from about 100 cps to about 3000 cps, in embodiments from about 100 cps to about 2000 cps, in embodiments of from about 100 cps to about 1000 cps. In embodiments, the (meth)acrylate oligomer has a glass transition temperature, $T_g$, of less than about 100° C., in embodiments less than about 70° C., in embodiments less than about 40° C., or in embodiments less than about 10° C. This includes embodiments in which the $T_g$ is in the range of from about −10° C. to about 100° C., from about 0° C. to about 50° C., or from about 25° C. to about 35° C.

The (meth)acrylate oligomer may be provided in the interlayer composition in various suitable amounts. In embodiments, the (meth)acrylate oligomer is present in an amount of from about 1% to about 27% by weight of the interlayer composition, in embodiments of from about 3% to about 24% by weight of the interlayer composition, in embodiments of from about 6% to about 18% by weight of the interlayer composition, in embodiments of from about 12% to about 15% by weight of the interlayer composition, or embodiments of from about 3% to about 10% by weight of the interlayer composition.

The interlayer composition may include various ratios of the multi-functional (meth)acrylate monomer diluent to the (meth)acrylate oligomer. In embodiments, the ratio of the multi-functional (meth)acrylate monomer diluent to the (meth)acrylate oligomer is in the range of from about 4 to about 16, from about 5 to about 14, from about 6 to about 12, or from about 9 to about 15.

A variety of photoinitiators may be used. Combinations of different types of photoinitiators may be used. In embodiments, two different types of photoinitiators are used. For example, a first photoinitiator selected to facilitate curing of the surface of the interlayer composition and a second photoinitiator selected to facilitate curing of the interlayer composition throughout its thickness (i.e., "depth of cure") may be used. The photoinitiator may be selected to have absorbance or an absorbance maximum within a particular range of ultraviolet wavelengths, in embodiments from about 100 nm to about 425 nm. Suitable photoinitiators include 1-hydroxycyclohexyl phenyl ketone; 2,2-dimethoxy-2-phenylacetophenone; 2-methyl-[4-(methylthio)phenyl]-2-morpholino-1-propanone; 2,4-dimethylthioxanthone; 2,4-diisopropylthioxanthone; isopropylthioxanthone; 2,4,6 Trimethylbenzoyldiphenylphosphine oxide (TPO); bis(2,6-dimethoxybenzoyl)-2,4,4 trimethylpentylphosphine oxide; and the like. The photoinitiators Irgacure-184 and Irgacure TPO-L, available from BASF, may be used.

The photoinitiator may be provided in the interlayer composition in various suitable amounts. In embodiments, the photoinitiator is present in an amount of from about 1% to about 20% by weight of the interlayer composition, in embodiments of from about 1% to about 15% by weight of the interlayer composition, in embodiments of from about 1% to about 12% by weight of the interlayer composition, or in embodiments of from about 2% to about 12% by weight of the interlayer composition. In embodiments in which two photoinitiators are used, a first photoinitiator (e.g., one selected to facilitate surface curing) may be present in an amount of from about 1% to about 10% by weight of the interlayer composition, in embodiments of from about 1% to about 8% by weight of the interlayer composition, or in embodiments of from about 2% to about 8% by weight of the interlayer composition. In such embodiments, the second photoinitiator (e.g., one selected to facilitate depth of cure) may be present in an amount of from about 0.5% to about 5% by weight of the interlayer composition, in embodiments of from about 0.5% to about 2.5% by weight of the interlayer composition, or in embodiments of from about 0.5% to about 2% by weight of the interlayer composition.

The interlayer composition may include a variety of additional, optional components. In embodiments, the interlayer composition includes a surface leveling agent to adjust the surface tension of the interlayer composition. A variety of surface leveling agents may be used and selected depending upon the choice of the other components of the interlayer composition. Combinations of different types of surface leveling agents may be used. Suitable surface leveling agents include silicone modified polyacrylate, polyester modified polydimethylsiloxane, polyether modified polydimethylsiloxane, polyacrylate modified polydimethylsiloxane, polyester polyether modified polydimethylsiloxane, low molecular weight ethoxylated polydimethylsiloxane, polyester modified polymethylalkylsiloxane, polyether modified polymethylalkylsiloxane, aralkyl modified polymethylalkylsiloxane, polyether modified polymethylalkylsiloxane, and the like.

The surface leveling agent may be a polysiloxane copolymer that includes a polyester modified polydimethylsiloxane, commercially available from BYK Chemical with the trade name of BYK® 310; a polyether modified polydimethylsiloxane, commercially available from BYK Chemical with the trade name of BYK® 330; a polyacrylate modified polydimethylsiloxane, commercially available from BYK Chemical with the trade name of BYK®-SILCLEAN 3700 (about 25 weight percent in methoxypropylacetate); or a polyester polyether modified polydimethylsiloxane, commercially available from BYK Chemical with the trade name of BYK® 375. The surface leveling agent may be a low molecular weight ethoxylated polydimethylsiloxane with the trade name Silsurf® A008 available from Siltech Corporation. Other surface leveling agents commercially available from BYK Chemical may be used as follows: BYK® 377 (Polyether-modified, hydroxy-functional polydimethylsiloxane), BYK® 3455 (Polyether-modified polydimethylsiloxane), BYK® 9077 (High molecular-weight copolymer with pigment affinic groups), BYK®-UV3500 (Polyether-modified, acryl-functional polydimethylsiloxane), BYK®-UV3510 (Polyether-modified polydimethylsiloxane), and BYK®-UV3505 and BYK®-UV3575 (multiacrylic functional, modified polydimethylsiloxane).

The surface leveling agent may be provided in the interlayer composition in various suitable amounts. In embodiments, the surface leveling agent is present in an amount of from about 0.01% to about 3% by weight of the interlayer composition, in embodiments from about 0.1% to about 2% by weight of the interlayer composition, or in embodiments from about 0.5% to about 1% by weight of the interlayer composition.

Other additional, optional components include curing accelerators, surfactants or combinations thereof.

Another additional component includes one or more types of mono-functional (meth)acrylate monomers. If present, these may be included in an amount of from about 0.5% to about 18% by weight of the interlayer composition, in embodiments from about 2% to about 16% by weight of the interlayer composition, in embodiments from about 4% to about 12% by weight of the interlayer composition, in embodiments from about 8% to about 10% by weight of the interlayer composition, or in embodiments from about 2% to about 10% by weight of the interlayer composition.

In embodiments, the interlayer composition consists or consists essentially of one or more types of multi-functional (meth)acrylate monomer diluents, one or more types of (meth)acrylate oligomers, one or more types of photoinitiators, optionally, one or more types of surface leveling agents, optionally, one or more types of curing accelerators, optionally, one or more types of surfactants, optionally one or more types of mono-functional (meth)acrylate monomer diluents. In other embodiments, the interlayer composition consists or consists essentially of one or more types of multi-functional (meth)acrylate monomer diluents, one or more types of (meth)acrylate oligomers, one or more types of photoinitiators, and one or more types of mono-functional (meth)acrylate monomer diluents.

In embodiments, the interlayer composition does not include a solvent, e.g., an organic solvent.

The interlayer composition may be formed by combining and mixing the selected components in a suitable container.

The interlayer composition may be characterized by its dynamic viscosity at 25° C. In embodiments, the interlayer composition has a dynamic viscosity at 25° C. in the range of from about 10 cps to about 500 cps, in embodiments of from about 10 cps to about 250 cps, or in embodiments from about 10 cps to about 100 cps. The dynamic viscosity of the interlayer composition may be measured using a commercially available rheometer (e.g., Ares-G2 from TA Instruments).

The interlayer composition may be characterized by its surface tension at 25° C. In embodiments, the interlayer composition has a surface tension at 25° C. in the range of from about 22 mN/m to around 40 mN/m, in embodiments from about 23 mN/m to about 42 mN/m, in embodiments from about 25 mN/m to about 38 mN/m, or in embodiments from about 28 mN/m to about 35 mN/m. The surface tension of the interlayer composition may be measured using a commercially available tensiometer (e.g., Force Tensiometer K100 from KRUSS GmbH).

The interlayer composition may be characterized by one or more of the properties described above, i.e., one or more of dynamic viscosity and surface tension.

Interlayer Film

The interlayer composition may be used to form an interlayer film which facilitates the adhesion of other material layers, including conductive layers, to an underlying substrate. The interlayer film may be formed by depositing the interlayer composition on or over a substrate and exposing the deposited interlayer composition to ultraviolet (UV) light under conditions sufficient to cure the interlayer composition to form the interlayer film.

The interlayer composition may be deposited onto the substrate by a variety of techniques, including solution-based deposition techniques such as spin coating, dip coating, spray coating, slot die coating, flexographic printing, offset printing, screen printing, gravure printing, aerosol printing, ink jet printing, and the like. A variety of substrates may be used. Suitable substrates include those composed of silicon, glass, polyester, polycarbonate, polyethylene terephthalate (PET), polyimide, polyethylene naphthalate (PEN), and the like. Fabric and synthetic paper substrates may also be used. The material and the thickness of the substrate may be selected such that the substrate has a desired flexibility or rigidity.

The curing conditions include, for example, the wavelength of the UV light, the curing temperature, the curing time (which may be adjusted by the curing speed, e.g., when the source of the UV light is scanned over the deposited interlayer composition), and the curing atmosphere. Various UV wavelengths may be used. In embodiments, the UV wavelength is in the range of from about 100 nm to about 425 nm, in embodiments from about 200 nm to about 410 nm, or in embodiments from about 300 nm to about 410 nm. Any light source providing wavelengths within these ranges may be used, e.g., mercury arc lamps. In embodiments, the curing temperature is room temperature, i.e., from about 20° C. to about 25° C. In embodiments, the curing time is less than about 10 minutes, in embodiments less than about 5 minutes, or in embodiments, less than about 1 minute. This includes embodiments in which the curing time is in the range of about 30 seconds to about 10 minutes. The curing may be performed in air, in an inert atmosphere, for example, under nitrogen or argon, or in a reducing atmosphere, for example, under nitrogen containing from about 1% to about 20% by volume hydrogen. The curing may be performed under normal atmospheric pressure, or at a superatmospheric pressure of, for example, from 2 to 500 atmospheres, or at a reduced pressure of, for example, about 1000 mbars to about 0.01 mbars.

The cured interlayer composition, i.e., the interlayer film, may be characterized by its average thickness. By "average thickness" it is meant the average value of the thickness of the interlayer film across its surface. In embodiments, the average thickness of the interlayer film is less than about 15 µm, in embodiments less than about 10 µm, in embodiments less than about 5 µm, in embodiments less than about 1 µn, or in embodiments less than about 800 nm. This includes embodiments in which the average thickness of the interlayer film is in the range of from about 200 nm to about 15 µm or from about 800 nm to about 15 µm. Thus, the interlayer films provided by the present disclosure are quite thin. As demonstrated by the Examples below, despite their thinness, the interlayer films that have been formed adhere well to underlying substrates and overlying conductive layers.

The interlayer film may be characterized by its glass transition temperature, $T_g$. In embodiments, the $T_g$ is less than about 100° C., in embodiments less than about 70° C., in embodiments less than about 40° C. This includes embodiments in which the $T_g$ is in the range of from about −10° C. to about 100° C., from about 0° C. to about 50° C., from about 20° C. to about 40° C., or from about 25° C. to about 35° C. The glass transition temperature of the interlayer film may be measured using modulated differential scanning calorimetry on a commercially available differential scanning calorimeter (e.g., Discovery DSC 2500 from TA Instruments).

The interlayer film may be characterized by its Young's modulus at room temperature. In embodiments, the Young's modulus is less than about 1 kgf/mm$^2$, in embodiments less than about 0.8 kgf/mm$^2$, or in embodiments less than about 0.6 kgf/mm$^2$. This includes embodiments in which the Young's modulus is in the range of from about 0.2 kgf/mm$^2$ to about 1 kgf/mm$^2$. The Young's modulus of the interlayer film may be measured by dynamic mechanical analysis. For example, the interlayer film may be cut into a "dog-bone" shaped piece suitable for analysis on a commercially available tensile testing instrument such as an Instron® tensile testing instrument.

The interlayer film may be characterized by its surface free energy at 25° C. In embodiments, the interlayer film has a surface free energy at 25° C. in the range of from about 22 mN/m to around 40 mN/m, in embodiments from about 23 mN/m to about 43 mN/m, in embodiments from about 25 mN/m to about 38 mN/m, or in embodiments from about 28 mN/m to about 35 mN/m. The surface free energy of the interlayer film may be measured using a commercially available tensiometer (e.g., Force Tensiometer K100 from KRUSS GmbH).

The interlayer film may be characterized by its surface roughness, using a suitable surface roughness parameter such as Ra, Rz, Rq, Rsk, and the like. In embodiments, the surface roughness, determined using the surface roughness parameter Ra (see, e.g., U.S. Pat. No. 9,333,742 hereby incorporated by reference in its entirety), is less than about ±10 nm, less than about ±5 nm, or less than about ±2 nm. These values are indicative of a uniform, smooth surface. The surface roughness parameters may be measured by a commercially available profilometer such as a Nanovea® Profilometer.

The interlayer film may be characterized by its instant water contact angle at room temperature. In embodiments, the water contact angle is in the range of from about 45 degrees to about 105 degrees, in embodiments from about 55 degrees to about 95 degrees, or in embodiments from about 65 degrees to about 85 degrees. The instant water contact angle may be measured by a commercially available contact angle analyzer such as FTA Dynamic Contact Angle Analyzer, DAT Instruments USA.

The interlayer film may be characterized by one or more of the properties described above, i.e., one or more of an average thickness, glass transition temperature, Young's modulus, surface free energy, surface roughness, and instant water contact angle. The particular selection of components and relative amounts of such components of the interlayer film may be adjusted to achieve one or more of these properties.

Multilayer Structure

As described above, the interlayer film may be used to facilitate the adhesion of other material layers, including conductive layers, to an underlying substrate. Thus, the interlayer film may be part of a multilayer structure. In embodiments, the multilayer structure includes the substrate, the interlayer film disposed over the surface of the substrate, and a conductive layer disposed over the surface of the interlayer film. In embodiments, the multilayer structure includes the substrate, the interlayer film on (i.e., directly on) the surface of the substrate, and a conductive layer on (i.e., directly on) the surface of the interlayer film. The conductive layer may be formed from a conductive composition. The conductive composition may include a variety of materials, including metal nanoparticles. In embodiments, the metal nanoparticles include silver nanoparticles. Conductive compositions including silver nanoparticles such as those disclosed in U.S. Pat. Nos. 8,765,025; 8,361,350; 8,324,294; 8,298,314; 8,158,032; 8,057,849; and 7,270,694 may be used.

After deposition and curing of the interlayer composition to form the interlayer film as described above, the multilayer structure may be formed by depositing the conductive composition on or over the interlayer film. Deposition may be accomplished by a variety of techniques, including solution-based deposition techniques, as described above with respect to the interlayer composition. In embodiments, the deposited conductive composition is subsequently annealed to form the conductive layer. Annealing may be used to provide a conductive layer including sintered metal nanoparticles, e.g., sintered silver nanoparticles. Annealing may be accomplished via a variety of techniques, including, for example, thermal heating, radiation with light (e.g., infrared, microwave, ultraviolet), and the like.

The conductive layer need not fully cover the surface of the underlying interlayer film. For example, depending upon the deposition technique, the conductive layer may include a plurality of conductive features arranged according to a pre-determined pattern or design. Conductive features include, for example, electrodes, pads, interconnects, traces, lines, tracks, and the like. Inkjet printing is a deposition technique that may be used to provide such conductive features.

Additional material layers may be included in the multilayer structure. The multilayer structure may be part of an electronic device (or a component thereof). Electronic devices, include, for example, thin film transistors, light emitting diodes, RFID tags, photovoltaics, displays, printed antenna, and the like.

As described above, in embodiments, the interlayer films provide excellent adhesion of conductive layers to an underlying substrate, while maintaining the desired properties of the conductive layers, including the conductivity of the conductive layers. In embodiments, the conductivity of the conductive layer in the multilayer structure is greater than about 100 Siemens/centimeter (S/cm), in embodiments greater than about 1000 S/cm, in embodiments greater than about 2,000 S/cm, in embodiments greater than about 5,000 S/cm, in embodiments greater than about 10,000 S/cm, or in embodiments greater than about 50,000 S/cm. This includes embodiments in which the conductivity is in the range of from about $6 \times 10^4$ S/cm to about $2 \times 10^5$ S/cm. Conductivity may be measured by measuring the volume resistivity of the conductive layer with a commercially 4-point probe apparatus (e.g., from Cascade Microtech, Inc.). Conductivity=1/Resistivity. In embodiments, substantially none of the conductive layer is removed during an adhesion test. An adhesion test is described in the Examples below. By "substantially none," it is meant that no conductive layer is removed under visual inspection.

EXAMPLES

The following Examples are being submitted to illustrate various embodiments of the present disclosure. These Examples are intended to be illustrative only and are not intended to limit the scope of the present disclosure. Also, parts and percentages are by weight unless otherwise indicated. As used throughout this patent specification, "room temperature" refers to a temperature of from about 20° C. to about 25° C.

Interlayer Compositions

Interlayer compositions were formed by mixing together the components at the amounts shown in Table 1. The amounts are given as weight percent by total weight of the interlayer composition.

TABLE 1

Formulations of the Interlayer Compositions.

| Component | Sample 1 | Sample 2 |
|---|---|---|
| Multi-functional Acrylate Monomer (SR-9003B, Sartomer Co. Inc.) | 79.6 | 79.6 |
| Acrylate Oligomer 1 (SD-5907, DIC Corporation) | 12.2 | — |
| Acrylate Oligomer 2 (SD-661, DIC Corporation) | — | 12.0 |
| Photoinitiator 1 (Irgacure-184, BASF) | 6.5 | 6.7 |
| Photoinitiator 2 (Irgacure TPO-L, BASF) | 1.7 | 1.6 |
| Total | 100 | 100 |

Interlayer Films

The interlayer compositions were deposited onto pre-cleaned glass microscope slides or polyethylene naphthalate substrates using a SCS P6700 Spin Coater. The coating speed was set at 100 rpm for 5 seconds, then increased to 1600 rpm and kept at this speed for 60 seconds. The spin coated samples were UV cured using a Fusions UV 600 Lighthammer equipped with a D bulb mercury lamp on a moving track at 32 fpm belt speed. The area of exposure was 12 inches. Thus, the curing time per 12 inches was 1.875 seconds. The curing was conducted at room temperature and in air at atmospheric pressure.

Conductive Layers

A conductive composition including 15% solids silver nanoparticles was spin coated onto the interlayer films using the same conditions as described for the interlayer films. Comparative samples were formed by spin coating the conductive composition directly onto the substrates (i.e., no interlayer film). The spin coated samples were then annealed at 120° C. for 10-30 minutes.

Curing Test

To test if the interlayer films were fully cured, the surface of the interlayer films were rubbed using a sponge tip moistened with isopropyl alcohol and the sponge tip visually evaluated. No marks or smears on the sponge tip indicated complete curing. Interlayer films formed from the interlayer compositions were fully cured.

Adhesion Test

The resulting conductive layers were subjected to an adhesion test by sticking Scotch® Magic™ Tape to the surface of the conductive layers, then peeling the tape off of the surface, and visually evaluating the tape. For the comparative samples without any interlayer film, the adhesion of the conductive layers was very poor, resulting in a large amount of the conductive layer peeling off the substrate and onto the tapes. For the samples with the interlayer film, the adhesion of the conductive layers was very good, resulting in no conductive layer or interlayer film peeling off the substrate and clear tapes.

It will be appreciated that variants of the above-disclosed embodiments and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A multilayer structure comprising:
   a substrate;
   an interlayer film on the substrate, the interlayer film formed from a UV curable interlayer composition comprising
   at least one aliphatic di(meth)acrylate monomer diluent having a dynamic viscosity at 25° C. of less than about 100 cps;
   at least one (meth)acrylate oligomer selected from epoxy (meth)acrylates, polyester (meth)acrylates, polyether (meth)acrylates, urethane (meth)acrylates and combinations thereof, the at least one (meth) acrylate oligomer having a glass transition temperature in the range of from about minus 10° C. to about 100° C. and a dynamic viscosity at 25° C. of less than about 3000 cps; and
   at least two photoinitiators; and
   a conductive layer on the interlayer film, the conductive layer comprising sintered metal nanoparticles;
   wherein the aliphatic (meth)acrylate monomer diluent is present in an amount of from about 50% to about 95% by weight of the interlayer composition, wherein the (meth)acrylate oligomer is present in an amount of from about 1% to about 27% by weight of the interlayer composition, and further wherein the interlayer composition comprises the ratio of the at least one aliphatic di(meth)acrylate monomer diluent to the at least one (meth)acrylate oligomer is in the range of from about 4:1 to about 16:1.

2. The multilayer structure of claim 1, wherein the sintered metal nanoparticles comprise sintered silver nanoparticles.

3. The multilayer structure of claim 1, wherein the average thickness of the interlayer film is less than about 15 μm.

4. The multilayer structure of claim 1, wherein the interlayer film has a Tg in the range of from about minus 10° C. to about 100° C.

5. The multilayer structure of claim 1, wherein the interlayer film has a Young's modulus at room temperature in the range of from about 0.2 kgf/mm$^2$ to about 1 kgf/mm$^2$.

6. The multilayer structure of claim 1, wherein the conductive layer exhibits a conductivity in the range of from about $6 \times 10^4$ S/cm to about $2 \times 10^5$ S/cm.

7. The multilayer structure of claim 1, wherein the interlayer film has a surface free energy at 25° C. of from about 23 mN/m to about 43 mN/m.

8. The multilayer structure of claim 1, wherein the interlayer film has an instant water contact angle at room temperature of from about 45 degrees to about 105 degrees.

9. The multilayer structure of claim 1, wherein the interlayer film exhibits each of the following properties: a Tg in the range of from about 25° C. to about 35° C.; a Young's modulus at room temperature in the range of from about 0.2 kgf/mm$^2$ to about 1 kgf/mm$^2$; a surface free energy at 25° C. of from about 23 mN/m to about 43 mN/m, and an instant water contact angle at room temperature of from about 45 degrees to about 105 degrees.

10. The multilayer structure of claim 1, wherein the at least one aliphatic di(meth)acrylate monomer diluent is an alkoxylated neopentyl glycol di(meth)acrylate.

11. A multilayer structure comprising:
   a substrate;
   an interlayer film on the substrate, the interlayer film formed from a UV curable interlayer composition comprising
   at least one aliphatic di(meth)acrylate monomer diluent having a dynamic viscosity at 25° C. of less than about 100 cps;
   at least one (meth)acrylate oligomer selected from epoxy (meth)acrylates, polyester (meth)acrylates, polyether (meth)acrylates, urethane (meth)acrylates and combinations thereof, the at least one (meth) acrylate oligomer having a glass transition temperature in the range of from about minus 10° C. to about 100° C. and a dynamic viscosity at 25° C. of less than about 3000 cps; and
   at least two photoinitiators, wherein the interlayer composition comprises from about 60% to about 95% by weight of the at least one aliphatic di(meth) acrylate monomer diluent, from about 3% to about 20% by weight of the at least one (meth)acrylate oligomer, and from about 1% to about 10% by weight of the at least two photoinitiators; and
   a conductive layer on the interlayer film, the conductive layer comprising sintered metal nanoparticles;

wherein the interlayer composition comprises the ratio of the at least one aliphatic di(meth)acrylate monomer diluent to the at least one (meth)acrylate oligomer is in the range of from about 4:1 to about 16:1.

12. The multilayer structure of claim 11, wherein the at least one aliphatic di(meth)acrylate monomer diluent is an alkoxylated neopentyl glycol di(meth)acrylate.

13. The multilayer structure of claim 11, wherein the at least one aliphatic di(meth)acrylate monomer diluent is selected from alkoxylated neopentyl glycol di(meth)acrylates, alkyldiol di(meth) acrylates, alkoxylated alkyldiol di(meth)acrylates, alkyl glycol di(meth)acrylates, and combinations thereof.

14. The multilayer structure of claim 11, wherein the at least one aliphatic di(meth)acrylate monomer diluent is an alkoxylated neopentyl glycol di(meth)acrylate and the alkoxylated neopentyl glycol di(meth)acrylate is selected from ethoxylated neopentyl glycol di(meth)acrylate, propoxylated neopentyl glycol di(meth)acrylate, and combinations thereof.

15. The multilayer structure of claim 11, wherein the at least one aliphatic di(meth)acrylate monomer diluent is propoxylated neopentyl glycol diacrylate.

16. The multilayer structure of claim 11, wherein the at least one (meth)acrylate oligomer is selected from epoxy acrylates, polyether acrylates, urethane acrylates, and combinations thereof.

17. The multilayer structure of claim 11, wherein the interlayer composition consists essentially of one or more types of the aliphatic di(meth)acrylate monomer diluents; one or more types of the (meth)acrylate oligomer; two or more of the photoinitiators; optionally, one or more types of surface leveling agents, optionally, one or more types of curing accelerators, optionally, one or more types of surfactants; and optionally, one or more types of mono-functional (meth)acrylate monomer diluents.

18. The multilayer structure of claim 1, wherein the multi-functional (meth)acrylate monomer diluent is present in an amount of from about 60% to about 85% by weight of the interlayer composition, and wherein the (meth)acrylate oligomer is present in an amount of from about 6% to about 18% by weight of the interlayer composition.

19. The multilayer structure of claim 1, wherein the interlayer composition does not include an organic solvent.

* * * * *